US006259275B1

(12) United States Patent
Beiu

(10) Patent No.: US 6,259,275 B1
(45) Date of Patent: Jul. 10, 2001

(54) LOGIC GATE HAVING REDUCED POWER DISSIPATION AND METHOD OF OPERATION THEREOF

(75) Inventor: Valeriu Beiu, Dallas, TX (US)

(73) Assignee: RN2R, L.L.C., Dallas, TX (US)

( * ) Notice: Subject to any disclaimer, the term of this patent is extended or adjusted under 35 U.S.C. 154(b) by 0 days.

(21) Appl. No.: 09/562,347

(22) Filed: May 1, 2000

(51) Int. Cl.⁷ .............................. G06F 1/32; G06F 7/50; H03K 19/20
(52) U.S. Cl. ...................... 326/112; 326/95; 708/702; 713/324
(58) Field of Search ................. 326/104, 112, 326/95; 708/625, 704, 708, 713, 702; 713/324

(56) References Cited

U.S. PATENT DOCUMENTS

| | | | |
|---|---|---|---|
| 4,301,535 | * 11/1981 | McKenny et al. | 371/21 |
| 4,858,168 | 8/1989 | Hwang | 364/787 |
| 4,963,769 | * 10/1990 | Hiltpold et al. | 307/465 |
| 5,016,211 | 5/1991 | Jeong | 364/786 |
| 5,027,312 | 6/1991 | Knauer et al. | 364/787 |
| 5,034,918 | 7/1991 | Jeong | 365/49 |
| 5,086,405 | 2/1992 | Chung et al. | 364/748 |
| 5,095,457 | 3/1992 | Jeong | 364/758 |
| 5,095,458 | 3/1992 | Lynch et al. | 364/787 |
| 5,136,539 | 8/1992 | Kumar | 364/787 |
| 5,163,020 | 11/1992 | Chau | 364/788 |
| 5,272,662 | 12/1993 | Scriber et al. | 364/788 |
| 5,278,783 | 1/1994 | Edmondson | 364/787 |
| 5,357,528 | 10/1994 | Alon et al. | 371/37.9 |
| 5,408,145 | 4/1995 | Nguyen | 326/121 |
| 5,477,480 | 12/1995 | Inui | 364/787 |
| 5,497,343 | 3/1996 | Rarick | 364/787 |
| 5,539,332 | 7/1996 | Schmookler | 326/53 |
| 5,539,686 | 7/1996 | Murabayashi et al. | 364/787 |
| 5,572,150 | 11/1996 | Karlschoke et al. | 326/95 |
| 5,579,254 | 11/1996 | Kumar et al. | 364/788 |
| 5,581,497 | 12/1996 | Kumar | 364/787 |
| 5,631,860 | 5/1997 | Morinaka | 364/787 |
| 5,636,156 | 6/1997 | Mikan, Jr. et al. | 364/787 |
| 5,636,157 | 6/1997 | Hesson et al. | 364/788 |
| 5,701,504 | 12/1997 | Timko | 395/800 |
| 5,712,826 | * 1/1998 | Wong et al. | 365/226 |
| 5,719,803 | 2/1998 | Naffziger | 364/787.01 |
| 5,732,008 | 3/1998 | Abu-Khater et al. | 364/788 |
| 5,812,521 | 9/1998 | Levenstein et al. | 364/784.02 |
| 5,847,984 | 12/1998 | Mahurin | 364/787.01 |
| 5,852,568 | 12/1998 | Ranjan | 364/788 |
| 5,867,038 | 2/1999 | Kartschoke et al. | 326/45 |
| 5,990,709 | 11/1999 | Thewes et al. | 327/89 |
| 5,991,789 | 11/1999 | Prange et al. | 708/625 |

(List continued on next page.)

FOREIGN PATENT DOCUMENTS

407271477 * 10/1995 (JP) .

OTHER PUBLICATIONS

"Capacitive Threshold–Logic Gate" by Kakan Ozdemir, Asim Kepkep, Banu Pamir, Ysuf Leblebici and Ugur Cilingiroglu; IEEE Journal of Solid–State Circuits; Aug. 1996; pp. 1141–1150.

"Explicit Constructions of Depth–2 Majority Circuits for Comparison and Addition" by Noga Alon and Jehoshua Bruck; Feb. 1994; pp. 1–8.

"On the Circuit and VLSI Complexity of Threshold Gate Comparison" by Valeriu Beiu; 1998; pp. 1–29.

*Primary Examiner*—Michael Tokar
*Assistant Examiner*—Daniel D. Chang

(57) ABSTRACT

A circuit for, and method of, decreasing DC power dissipation in a logic gate and a processor incorporating the circuit or the method. In one embodiment, wherein the logic gate has at least two binary inputs adapted to receive corresponding input binary digits, the circuit includes: (1) a combinatorial logic power down circuit that develops a power down signal as a function of an input-data signal and at least one of the input binary digits and (2) a switch, coupled to the power down circuit, that interrupts DC current to at least a portion of the logic gate as a function of the power down signal.

70 Claims, 6 Drawing Sheets

OTHER PUBLICATIONS

Lecture Notes in Computer Science "Engineering Applications of Bio–Inspired Artificial neural Networks" article entitled "Beta–CMOS Artificial Neuron and Implemetability Limits" by Victor Varshavsky and Vyacheslav Marakhovsky; Jun. 1999; pp. 116–128.

"A Regular Layout for Parallel Adders" by Richard P. Brent and H. T. Kung; 1982 IEEE, pp. 260–264.

"Neural Logic: Theory and Implementation" by Vasken Bohossian; 1998; pp. 1–99.

"Low Weight and Fan–In Neural Networks for Basic Arithmetic Operations" by Sorin Cotofana and Stamatis Vassiliadis; Aug. 1997; 6 pages pp. 1–6.

"Periodic Symmetric Functions with Feed–Forward Neural Networks" by Sorin Cotofana and Stamatis Vassiliadis; Mar. 1996, pp. 215–221.

"2–1 Redundant Addition with Threshold Logic" by Sorin Cotofana and Stamatis Vassiliadis; Nov. 1996; pp. 889–893.

"On the Circuit Complexity of Sigmoid Feedforward Neural Networks" by Valeriu Beiu and John G. Taylor; 1996; pp. 1155–1171.

"Area–Time Performances of Some Neural Computations" by Valeriu Beiu, Jan A. Peperstraete, Joos Vandewalle, and Rudy Lauwereins; 1994; pp. 664–664–668.

"Implementation of Threshold Logic" by Alexander Stokman; Masters Thesis, Delft University of Technology; Jan. 23, 1998 (pp. 1–83).

"2–1 Addition and Related Arithmetic Operations with Threshold Logic" by Stamatis Vassiliadis, Sorin Cotofana and Koen Bertels; Sep. 1996; pp. 1–14.

* cited by examiner

LOGIC GATE HAVING REDUCED POWER DISSIPATION AND METHOD OF OPERATION THEREOF

CROSS-REFERENCE TO RELATED APPLICATIONS

This application is related to the following U.S. Patent applications:

| Reference No. | Title | Inventor | Date |
|---|---|---|---|
| 09/158,947 ('947 application) | Adder and Multiplier Circuits Employing Logic Gates Having Discrete, Weighted Inputs and Methods of Performing Combinatorial Operations Therewith | Beiu | Filed September 21, 1998 |
| 09/392,811 ('811 application) | Conductance-based Logic Gate and Methods of Operation and Manufacturing Thereof | Beiu | Filed Sept. 9, 1999 |
| 09/406,367 ('367 application) | Noise Tolerant Conductance-based Logic Gate and Methods of Operation and Manufacturing Thereof | Beiu | Filed Sept. 28, 1999 |
| 09/407,598 ('598 application) | Adder Having Reduced Number of Internal Layers and Method of Operation Thereof | Beiu | Filed Sept. 28, 1999 |

The above-listed applications are commonly assigned with the present invention and are incorporated herein by reference as if reproduced herein in their entirety.

TECHNICAL FIELD OF THE INVENTION

The present invention is directed, in general, to logic gates and, more specifically, to a logic gate having reduced power dissipation and method of operation thereof.

BACKGROUND OF THE INVENTION

Digital systems are used extensively in computation and data processing, controls, communications and measurement. Digital systems use digital signals that may only assume discrete values. Typically, digital systems use binary signals that employ only two values. Since such systems only use two distinct values, errors caused by component variations are minimized. As a result, a digital system may be designed such that, for a given input, an output thereof is exactly correct and repeatable. This gives rise to the extreme accuracy for which digital systems are well known.

Analog systems, on the other hand, use analog signals that vary continuously over a specified range. Analog systems are thus particularly vulnerable to error, depending on the accuracy of the components used therein. Since digital systems are generally capable of greater accuracy and reliability than analog systems, many tasks formerly performed by analog systems are now performed exclusively by digital systems.

One basic building block of digital systems is a logic gate. Conventional logic gates have one output and one or more inputs. The number of inputs is called the "fan-in" of the gate. The state of the output is completely determined by the state(s) of the input(s). Conventional logic gates are typically created by coupling a number of transistors together to perform a Boolean function (e.g., AND, OR, NOT). The logic gates are then coupled together to form a multi-layer circuit that is capable of performing logical functions (e.g., arithmetic functions).

Increasing processing power is a continuing goal in the development of processors such as microprocessors or digital signal processors (DSPs). Processor designers are generally familiar with three ways to increase the processing power of a central processing unit (CPU). The CPU's clock frequency may be increased so that the CPU can perform a greater number of operations in a given time period. Processors are designed to operate at increasingly high clock frequencies. While a higher clock frequency generally results in increased processing power, the higher clock frequency also increases power dissipation, resulting in higher device operating temperatures. Processor designers, therefore, must address these additional problems to avoid catastrophic device failures.

Another way to increase processing power is to increase input and output data bus width, thereby allowing the CPU to process a greater amount of code and data. Early processors were packaged using dual in-line packaging (DIP) technology. Increasing the width of the data buses was both expensive and unrealistic, often resulting in extremely large device packages. Today, with the use of pin grid array (PGA) packaging, increasing the size of the data buses no longer poses a packaging problem. Of course, a larger number of transistors is required to process the additional information conveyed by the wider data buses, which translates into increased power dissipation by the processor.

Yet another way to increase processing power is to change the internal architecture of the processor to overlap the execution of instructions by, for example, superscaling. This method also requires the addition of a large number of transistors, since entire processing stages or execution units must be duplicated. Performing a large number of instructions in parallel may also result in data dependency problems. Further, the additional transistors also increase power dissipation.

With the rise of portable and personal computing, power dissipation has become an important factor in the design of processors. Processors employed in desktop or server-based applications may be designed to maximize speed with little regard for power consumption. Processors employed in laptop, palmtop or other portable devices, however, must be designed with power consumption in mind due to the often limited capabilities of the batteries powering the portable devices. Since the processor includes a large number of logic gates, reducing power dissipation in the individual logic gates can accordingly reduce the power consumption of the processor as a whole.

Accordingly, what is needed in the art is a logic gate operable at high frequency that overcomes the disadvantages of prior art logic gates.

SUMMARY OF THE INVENTION

To address the above-discussed deficiencies of the prior art, the present invention provides, for use with a logic gate having a logic circuit that dissipates DC power during an operation thereof, a circuit for, and method of, decreasing the DC power dissipated in the logic circuit. The present invention further provides a logic gate and a processor (such as a microprocessor or a digital signal processor) incorporating the circuit or the method. The logic gate has at least two binary inputs adapted to receive corresponding input binary digits. In one embodiment, the circuit includes: (1) a combinatorial logic power down circuit that develops a power down signal as a function of an input-data signal and at least one of the input binary digits and (2) a switch, coupled to the power down circuit, that interrupts DC current to at least a portion of the logic circuit as a function of the power down signal.

In an alternative embodiment, circuit includes: (1) a combinatorial logic power down circuit that develops a power down signal as a function of an input-data signal and an output binary digit generated at an output of the logic gate and (2) a switch, 20 coupled to the power down circuit, that interrupts DC current to at least a portion of the logic circuit as a function of the power down signal.

The present invention therefore introduces the broad concept of employing a combinatorial logic power down circuit that implements a Boolean function to develop a power down signal that causes at least a portion of the logic gate to turn off to reduce power dissipation. This reduces the power consumption of the logic gate as a whole without materially affecting its speed performance.

In one embodiment of the present application, the logic gate is a conductance-based logic gate as described in the '811 application. Of course, the principles of the present invention are applicable to a wide variety of logic gates.

In one embodiment of the present invention, the power down circuit includes at least one pass transistor. The use of the pass transistor may significantly simplify an implementation of the combinatorial logic power down circuit. Further, the pass transistor implementation of the combinatorial logic power down circuit may consume less power than other conventional implementations.

In one embodiment of the present invention, the power down circuit develops the power down signal as a function of all of the input binary digits. In an alternative embodiment, the power down circuit develops the power down signal as a function of only some of the input binary digits. In either case, the power down signal is a Boolean function which may be determined by examining DC current paths in the logic gate during all possible operating conditions.

In one embodiment of the present invention, the input-data signal precedes the input binary digits. The input-data signal may thus ensure that the logic gate is powered before the input binary digits arrive at the respective binary inputs of the logic gate.

In one embodiment of the present invention, wherein the logic gate is a conductance-based logic gate, the logic circuit includes a summer. The switch interrupts the DC current to or from the summer to reduce the DC power dissipated by the logic circuit.

In a related embodiment, the summer is coupled between a positive reference voltage and a negative reference voltage. In such an embodiment, the switch may interrupt the DC current by decoupling the summer from the positive reference voltage. Alternatively, the switch may interrupt the DC current by decoupling the summer from the negative reference voltage.

In a preferred embodiment, wherein the switch is adapted to decouple the summer from the positive reference voltage, the circuit further includes a second switch that interrupts the DC current by decoupling the summer from the negative reference voltage. Decoupling the summer from the positive reference voltage, for example, leaves the summer connected to only the negative reference voltage. The output voltage from the summer may, therefore, be approximate the negative reference voltage. Similarly, decoupling the summer from the negative reference voltage will leave the summer connected to only the positive reference voltage. The output voltage from the summer will, in this case, be approximate the positive reference voltage. The noise rejection of the summer is thus increased.

In one embodiment of the present invention, wherein the logic gate is a conductance-based logic gate, the logic circuit includes a summer and a quantizer. In such an embodiment, the circuit may further include a second switch that interrupts current to the quantizer to further reduce the power dissipation of the logic gate.

In a related embodiment, the circuit for decreasing the DC power dissipated in the logic gate further includes a pre-charge circuit that pre-charges the summer to a predetermined voltage level. In a related embodiment, the predetermined voltage level is about a midpoint between a positive reference voltage and a negative reference voltage. By pre-charging the summer to about a midpoint between the possible output levels, the pre-charge circuit may allow the output of the logic gate to more quickly assume a desired level upon input of the input binary digits at the inputs of the logic gate. In this case, the quantizer may preferably be decoupled from the positive reference voltage and the negative reference voltage to reduce power dissipation.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
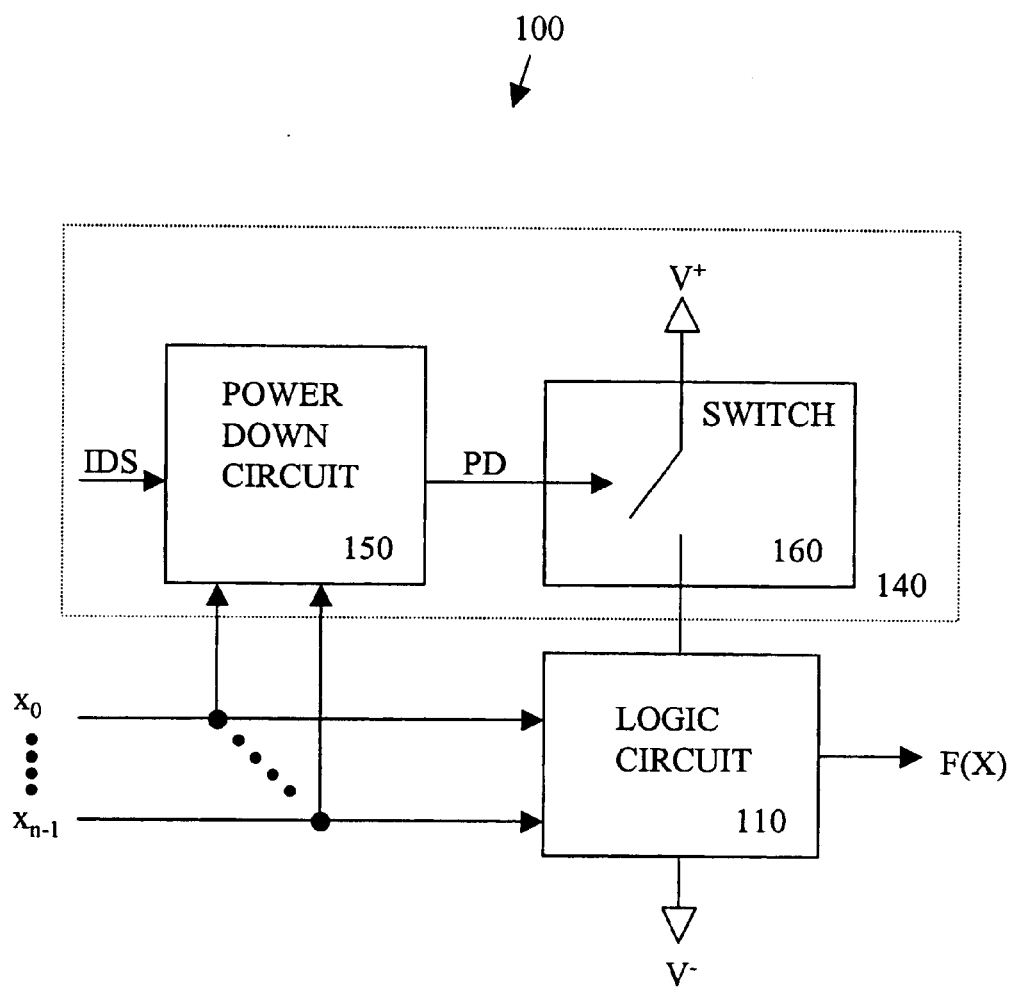
FIG. 1 illustrates a simplified schematic diagram of an embodiment of a logic gate constructed in accordance with the principles of the present invention.

Referring initially to FIG. 1, illustrated is a simplified schematic diagram of an embodiment of a logic gate 100 constructed in accordance with the principles of the present invention. The logic gate 100 includes a logic circuit 110 having a plurality of binary inputs $x_0, \ldots, x_{n-1}$. The logic circuit 110 is designed to perform the following function: $F(x_0, \ldots, x_{n-1})$. Since the logic circuit 110, and thus the logic gate 100 as a whole, may dissipate DC power during an operation thereof, the logic gate 100 of the present invention advantageously includes a circuit (power reduction circuit 140) for decreasing the DC power dissipated in the logic gate 100 during an operation thereof.

The power reduction circuit 140 includes a combinatorial logic power down circuit 150 that develops a power down signal PD as a function of an input-data signal IDS and at least one of the input binary digits presented at the binary inputs $x_0, \ldots, x_{n-1}$ of the logic gate 100. In the illustrated embodiment, the input-data signal IDS may be any signal that precedes the input binary digits. The power down circuit 150 receives the input-data signal IDS and the input binary digits and performs a Boolean function F(X) to develop the power down signal PD. The input-data signal IDS allows the power down circuit 150 to ensure that the power down signal PD is properly synchronized with the presentation of the input binary digits to the logic circuit 110.

The power reduction circuit 140 further includes a switch 160, coupled to the power down circuit 150, that interrupts DC current to at least a portion of the logic gate 100 as a function of the power down signal PD. In the illustrated embodiment, the logic circuit 110 is coupled between a positive reference voltage $V^+$ (e.g., VDD) and a negative reference voltage $V^-$ (e.g., GND) and draws DC current therefrom. The switch 160, therefore, may be coupled between the logic circuit 110 and the positive reference voltage $V^+$ to interrupt the DC current delivered to the logic circuit 110 from the positive reference voltage $V^+$. Alternatively, the switch 160 may be coupled between the logic circuit 110 and the negative reference voltage $V^-$. In either case, the switch 160 interrupts at least a part of the DC current to the logic circuit 110 once the logic circuit 110 has finished computing the function F(X) to thereby reduce the DC power dissipation of the logic circuit 110 and, therefore, the logic gate 100.

Figure 2:
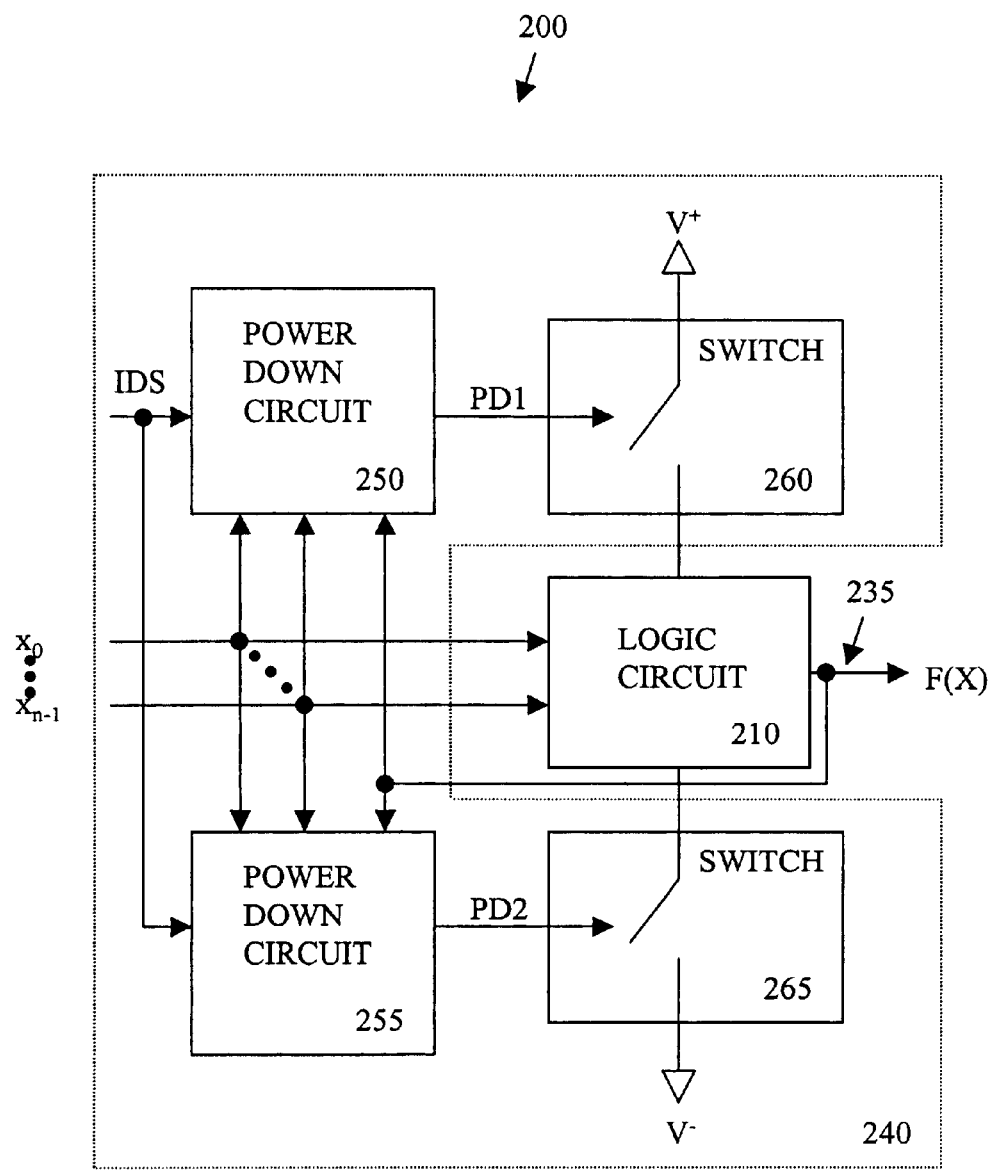
FIG. 2 illustrates a simplified schematic diagram of another embodiment of a logic gate constructed in accordance with the principles of the present invention.

Turning now to FIG. 2, illustrated is a simplified schematic diagram of another embodiment of a logic gate 200 constructed in accordance with the principles of the present invention. The logic gate 200 includes a logic circuit 210 having a plurality of inputs $x_0, \ldots, x_{n-1}$ and is designed to perform the function $F(x_0, \ldots, x_{n-1})$. The logic circuit 210 is coupled between a positive reference voltage $V^+$ (e.g., VDD) and a negative reference voltage $V^-$ (e.g., GND) and draws DC current therefrom. Since the logic circuit 210, and thus the logic gate 220 as a whole, may dissipate DC power during an operation thereof, the logic gate 200 advantageously includes a circuit (power reduction circuit 240) for decreasing the DC power dissipated in the logic gate 200 during an operation thereof.

In the illustrated embodiment, the power reduction circuit 240 includes first and second combinatorial logic power down circuits 250, 255 that respectively develop first and second power down signals PD1, PD2 as a function of an input-data signal IDS and at least one of the input binary digits presented at the inputs $x_0, \ldots, x_{n-1}$ of the logic gate 200. Alternatively, the first and second power down circuits 250, 255 may develop the first and second power down signals PD1, PD2 as a function of the input-data signal IDS and an output binary digit F(X) at an output 235 of the logic gate 200. In either case, the input-data signal IDS allows the first and second power down circuits 250, 255 to ensure that the first and second power down signals PD1, PD2 are properly synchronized with the arrival of the input binary digits. In the illustrated embodiment, the first power down circuit 250 performs a first Boolean function to develop the first power down signal PD1 while the second power down circuit 255 performs a second Boolean function to develop the second power down signal PD2.

The power reduction circuit 240 further includes first and second switches 260, 265 coupled to the first and second power down circuits 250, 255, respectively. The first switch 260 is coupled between the logic circuit 210 and a positive reference voltage $V^+$ (e.g., VDD). The second switch 265 is coupled between the logic circuit 210 and a negative reference voltage $V^-$ (e.g., GND). The first and second switches 260, 265 are adapted to receive the first and second power down signals PD1, PD2, respectively and interrupt the DC current to the logic circuit 210 as a function thereof. The power reduction circuit 240 may thus reduce DC power dissipation in the logic circuit 210 and, therefore, the logic gate 200.

Figure 3:
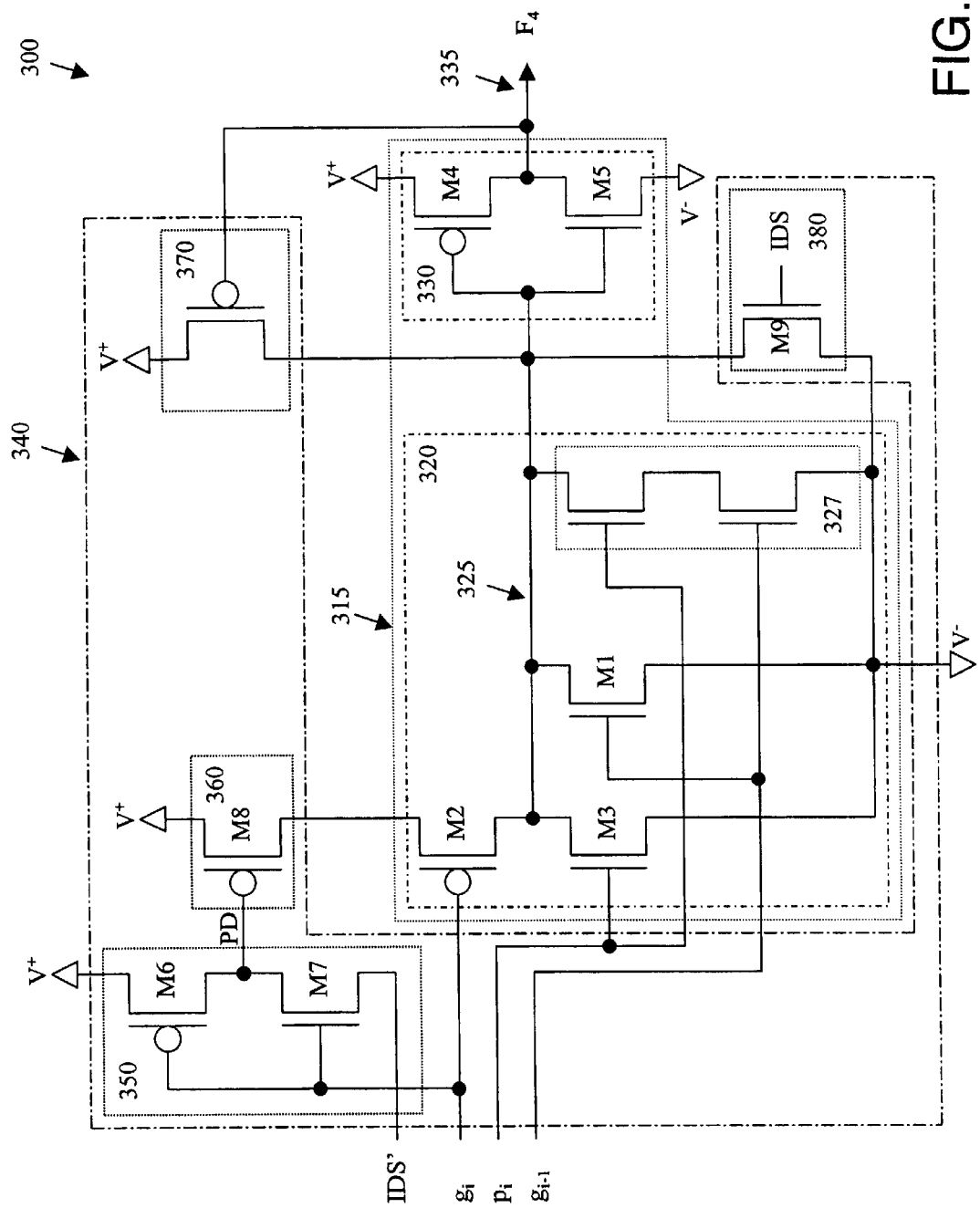
FIG. 3 illustrates a more detailed schematic diagram of another embodiment of a logic gate constructed in accordance with the principles of the present invention.

Turning now to FIG. 3, illustrated is a more detailed schematic diagram of another embodiment of a logic gate 300 constructed in accordance with the principles of the present invention. In the illustrated embodiment, the logic gate 300 is a conductance-based logic gate adapted to perform an $F_4$ function, which may be represented as follows:

$$F_4 = sgn(2 \cdot g_i + 1 \cdot p_i + 1 \cdot g_{i-1} - 2)$$

where "+" represents addition and "−" represents multiplication. Conductance-based logic gates are described in detail in the '811 application. Of course, the present invention is applicable to a wide variety of logic gates, including logic gates that dissipate DC power, such as conductance-based logic gates, pseudo-NMOS logic gates and β-driven threshold gates.

In the illustrated embodiment, the logic gate 300 includes a logic circuit 315 that dissipates DC power during an operation thereof. The logic gate 300 therefore advantageously includes a circuit (power reduction circuit 340) for decreasing the DC power dissipated in the logic circuit 315.

The logic circuit 315 includes a summer 320 having first, second and third binary inputs adapted to receive corresponding first, second and third input binary digits $g_{i-1}$, $g_i$, $p_i$, with corresponding first, second and third conductances representing first, second and third discrete weights. Since MOS transistors have an intrinsic on-state conductance, the first, second and third binary inputs include first, second and third MOS transistors M1, M2, M3 (either n-channel or p-channel), respectively. The intrinsic conductance of a MOS transistor is determined by the size of its channel.

In the illustrated embodiment, the first, second and third input binary digits $g_{i-1}$, $g_i$, $p_i$ are applied to the gates of first, second and third MOS transistors M1, M2, M3, respectively. The sources of the first and third MOS transistors M1, M3 are coupled to a negative reference voltage $V^-$ (e.g., GND). The source of the second MOS transistor M2 is coupled to a positive reference voltage $V^+$ (e.g., VDD). The first, second and third input binary digits $g_{i-1}$, $g_i$, $p_i$ may thus activate the respective MOS transistors to couple the respective reference voltages to a summing junction 325 of the summer 320 as a function of the corresponding particular input binary digit. The summer 320 then generates a weighted sum of the first, second and third input binary digits $g_{i-1}$, $g_i$, $p_i$.

The logic circuit 315 further includes a quantizer 330, coupled to the summer 320. The quantizer 330 generates an output binary digit at a binary output 335 thereof that is a function of the weighted sum. In the illustrated embodiment, the quantizer 330 is a CMOS inverter having fourth and fifth MOS transistors M4, M5. The quantizer 330 is capable of providing fast quantization of the weighted sum. Of course, other types of quantizers are well within the broad scope of the present invention. The summer 320 and the quantizer 330 are described in detail in the '947 and '811 applications.

The logic circuit 315 further includes a noise-suppression logic circuit 327, coupled to the summer 330, that increases a noise tolerance of the logic gate 300. The logic circuit 315 may also include anti-floating logic (not shown). See the '367 application for more information on noise tolerant conductance-based logic gates employing noise-suppression and anti-floating logic circuits.

The power reduction circuit 340 includes a combinatorial logic power down circuit 350 that develops a power down signal PD as a function of an input-data signal IDS and at least one of the first, second and third input binary digits $g_{i-1}$, $g_i$, $p_i$. The power down circuit 350 develops the power down signal PD as a function of the inverted input-data signal IDS' and the second input binary digit $g_i$. The power down circuit 350 includes sixth and seventh MOS transistors M6, M7 series-coupled between the positive reference voltage $V^+$ and the inverted input-data signal IDS'. In the illustrated embodiment, the sixth MOS transistor M6 is a p-channel MOS transistor, while the seventh MOS transistor M7 is an n-channel MOS transistor. The power down circuit 350 is a pass transistor implementation of the power down function to develop the power down signal, which may be represented as PD=$g_i'$+IDS'. Of course, other embodiments of the power down circuit 350 are possible and are well within the broad scope of the present invention.

The power reduction circuit 340 further includes a switch 360, coupled to the power down circuit 350, that interrupts DC current to the summer 320 as a function of the power down signal PD. In the illustrated embodiment, the switch 360 includes an eighth MOS transistor M8 (a p-channel MOS transistor) coupled between the summer 320 and the positive reference voltage $V^+$. Of course, the use of other types of switches is well within the broad scope of the present invention. The switch 360 and the power down circuit 350 thus form the circuit (power reduction circuit 340) for decreasing DC power dissipation in the logic circuit 315 and, therefore, logic gate 300 of the present invention.

Since the switch 360 is designed to selectively decouple the summer 320 from the positive reference voltage $V^+$, it may be necessary to store the output of the logic gate 300. In the to illustrated embodiment, the power reduction circuit 340 further includes a feedback circuit 370 coupled across the quantizer 330. The feedback circuit 370 may, in this example, be a half-keeper designed to latch a low (i.e., 0) level at the output of the logic gate 300. Alternatively, other storage mechanisms, such as a half-keeper designed to latch a high (i.e., 1) level, or a full keeper designed to latch both high and low levels, may be employed to store the output of the logic gate 300 during the period when the summer 320 is decoupled from the positive reference voltage $V^+$. Those skilled in the pertinent art are familiar with half-keeper and full-keeper circuits, as well as other latching circuits.

The power reduction circuit 340 still further includes a pre-charge circuit 380 that pre-charges the summing junction 325 (of the summer 320) to a predetermined level. In the illustrated embodiment, the pre-charge circuit 380 includes a switch M9 that couples the summing junction 325 to the negative reference voltage $V^-$.

The logic gate 300 operates as follows. Initially, the input-data signal IDS may be low (i.e., 0). The inverted input-data signal IDS' is high (i.e., 1). Due to the configuration of the power down circuit 350, both the sixth and seventh MOS transistors M6, M7 are now connected to a high level (e.g., M6 to $V^+$, M7 to "1"). Because the power down signal PD may be obtained either by propagating the positive reference voltage $V^+$ over the sixth MOS transistor M6 or by propagating the inverted input-data signal IDS' over the seventh MOS transistor M7, the power down signal PD will be high regardless of the second input binary digit $g_i$. In practice, however, the second input binary digit $g_i$ will be high due to the operation of the pre-charge circuit 380 from the previous logic gate (not shown). The eighth MOS transistor M8 of the switch 350 will therefore be in an OFF state, decoupling the summer 320 from the positive reference voltage $V^+$.

Then, at a time prior to the arrival of the first, second and third input binary digits $g_{i-1}$, $g_i$, $p_i$ at the gates of the first, second and third MOS transistors M1, M2, M3, the input-data signal IDS will go high. The inverted input-data signal IDS' will become low. With the inverted input-data signal IDS' low, the power down circuit 350 will appear to be an inverter, with the second input binary digit $g_i$ as the input thereto. The second input binary digit $g_i$ is high due to the operation of the pre-charge circuit 380 (from the previous logic gate). The output of the power down circuit 350 (i.e., the power down signal PD) will therefore be low, turning ON the eighth MOS transistor M8 of the switch 360 to provide DC power to the summer 320.

A short time after the input-data signal IDS goes high, the first, second and third input binary digits $g_{i-1}$, $g_i$, $p_i$ will arrive at the gates of the first, second and third MOS transistors M1, M2, M3. The summer 320 may then compute the sum to provide a weighted sum at the summing junction 325.

If the second input binary digit $g_i$ is high, the output of the power down circuit 350 will be low, and the eighth MOS transistor M8 of the switch 360 will remain ON. The second MOS transistor M2 of the summer 320, which is driven by the second input binary digit $g_i$, will be OFF. Therefore, substantially no DC current will flow through the summer 320.

If the second input binary digit $g_i$ is low, however, the second MOS transistor M2 of the summer 320 will be ON. Since both the eighth MOS transistor M8 of the switch 360 and the second MOS transistor M2 of the summer 320 are ON, a DC current path may be formed depending on the values of the first and third input binary digits $g_{i-1}$, $p_i$. The output of the summer 320 will be high. Since second input binary digit $g_i$ is low, the output of the combinatorial logic power down circuit 350 (the power down signal PD) will become high after a short delay. The eighth MOS transistor M8 will thus turn OFF, thereby interrupting the DC current to the summer 320 once the summer 320 has computed the sum. Since a high at the summing junction 325 translates to a low at the output of the logic gate 300, the feedback circuit 370 may keep the output of the summer 320 (at the summing junction 325) high and thus maintain the output of the logic gate 300 at a low level after the switch 360 has decoupled to the summer 320 from the positive reference voltage $V^+$. The logic circuit 315 may experience DC power dissipation due to DC currents flowing through the second and eighth transistors M2, M8 and the feedback circuit 370. The DC currents, however, may be reduced by adjusting the relative sizing of the second and eighth transistors M2, M8 and the transistor(s) forming the feedback circuit 370.

In the illustrated embodiment, the DC current to the summer 320 is interrupted a short time after the summer 320 has computed the sum. The delay in turning OFF the eighth MOS transistor M8 is due to a switching delay of the eight MOS transistor M8 itself, along with a switching delay of the sixth and seventh MOS transistors M6, M7 of the power down circuit 350. By sizing the relative MOS transistors of the power down circuit 350, the switch 360 and the summer 320, the delay between the interruption of the DC current and the computation of the sum may be adjusted.

Figure 4:
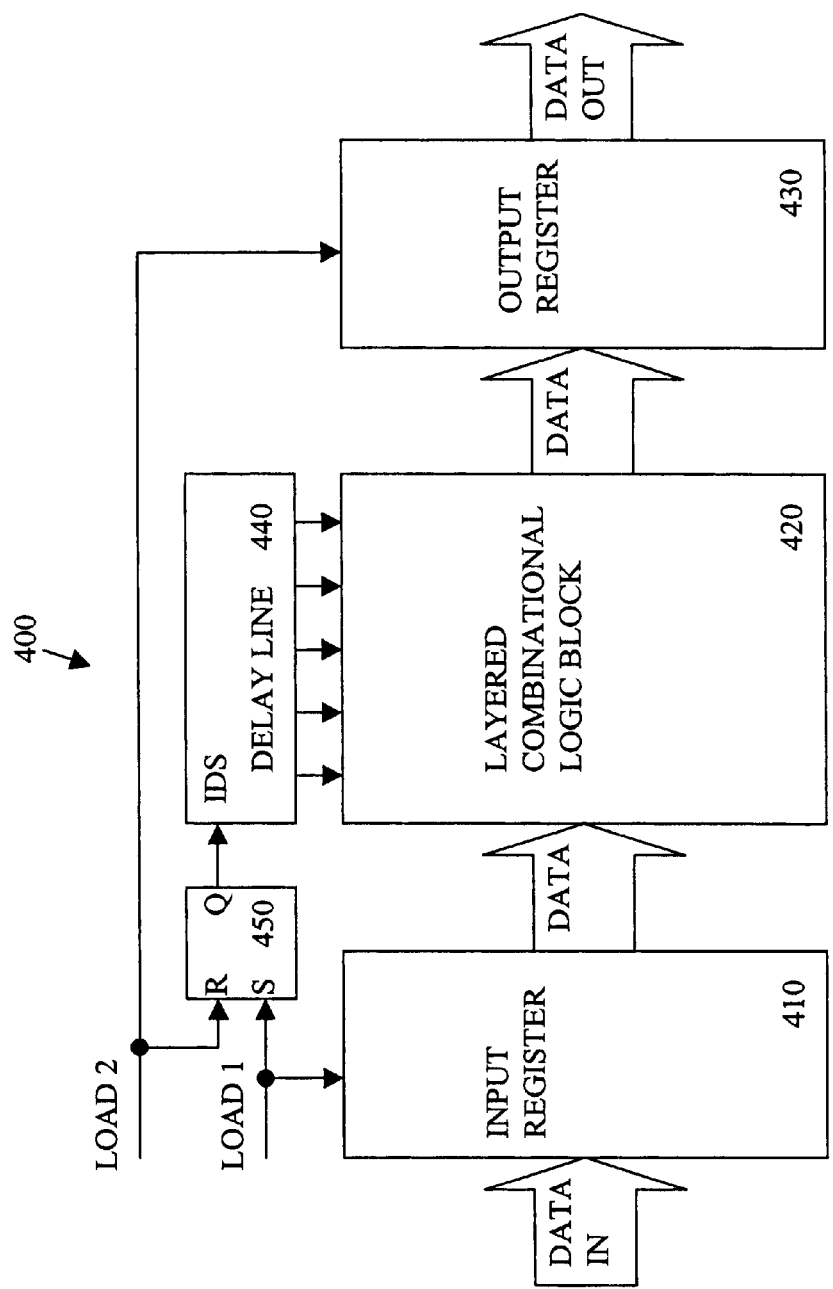
FIG. 4 illustrates a block diagram of an embodiment of a part of a processor constructed in accordance with the principles of the present invention.

Turning now to FIG. 4, illustrated is a block diagram of an embodiment of a part of a processing unit (processor) 400 constructed in accordance with the principles of the present invention. The processing unit 400 includes an input register 410 that receives and latches input data. The processing unit 400 further includes a layered combinational logic block 420, coupled to the input register 410, that receives the input data from the input register 410. In the illustrated embodiment, the layered combinational logic block 420 employs a number of circuit layers and may thus perform operations, such as addition, multiplication, etc. Each of the circuit layers may employ a logic gate of the present invention. The processing unit 400 further includes an output register 430. The output register 430 is coupled to the layered combinational logic block 420 and receives output data therefrom.

The processing unit 400 may include an optional delay line 440 coupled to the layered combinational logic block 420. In the illustrated embodiment, the delay line 440 includes a number of delay elements that propagate the input-data signal IDS to selectively allow DC current to each layer of the layered combinational logic block 420 as may be required to properly perform the required operation. Of course, the delay line 440 is not required by the present invention. The processing unit 400 still further includes a flip-flop 450 that receives first and second load signals LOAD1, LOAD2 and develops therefrom the input-data signal IDS.

In the illustrated embodiment, the first load signal LOAD1 is employed to load input data into the input register 410. The first load signal LOAD1 may thus be employed to set the flip-flop 450 to provide the input-data signal IDS to the layered combinational logic block 420 (through the optional delay line 440). Then, once the calculation has been completed, the second load signal LOAD2 is employed to load the resulting data to the output register 430. Since the combinational logic block 420 is no longer required to retain the data, the second load signal LOAD2 will reset the flip-flop 450. The layered combinational logic block 420 may thus experience a reduced DC power consumption when employing, within its layers, logic gates having the circuit for decreasing DC power dissipation of the present invention.

Figure 5:
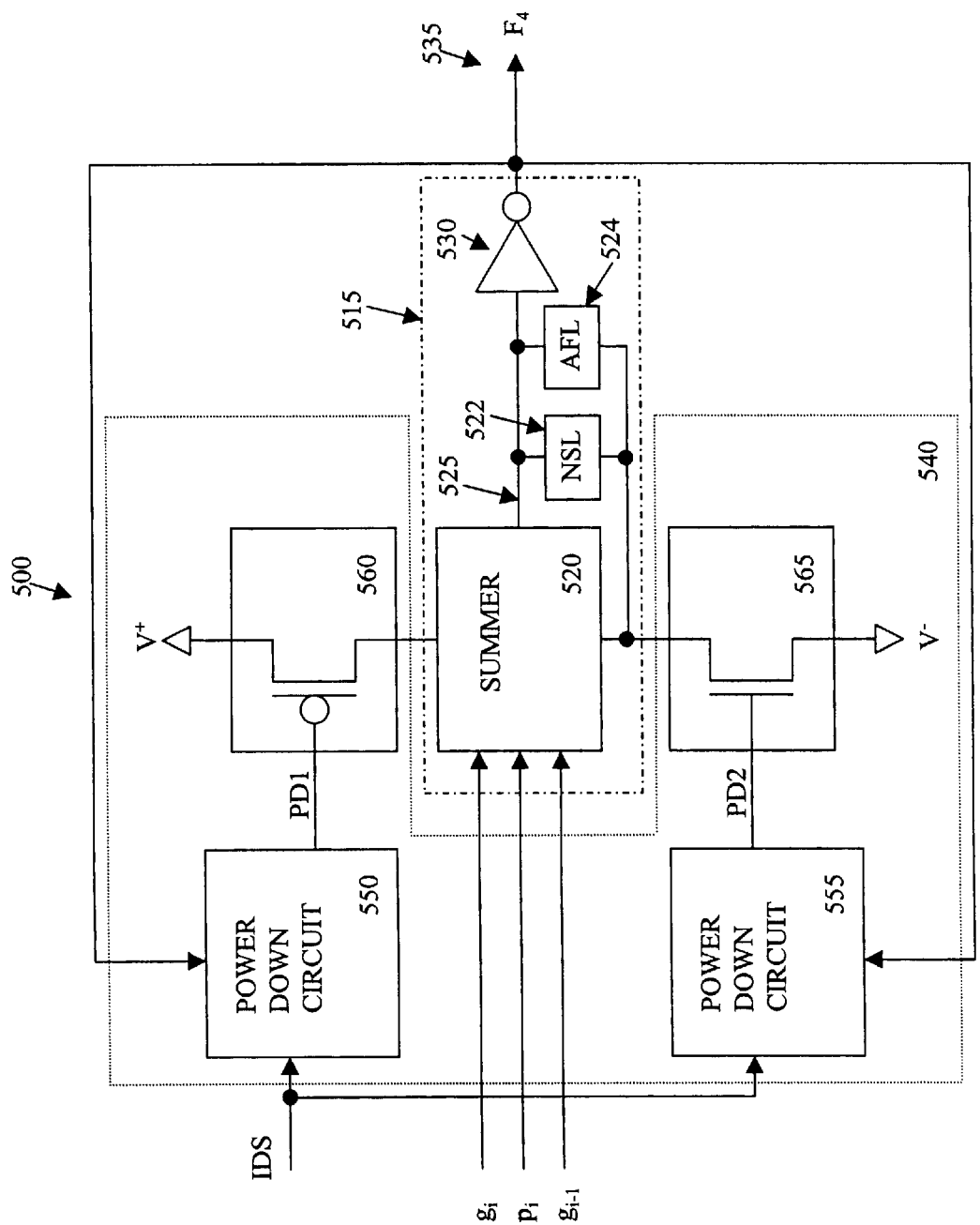
FIG. 5 illustrates a simplified schematic diagram of another embodiment of a logic gate constructed in accordance with the principles of the present invention.

Turning now to FIG. 5, illustrated is a simplified schematic diagram of another embodiment of a logic gate 500 constructed in accordance with the principles of the present invention. The logic gate 500, analogous to the logic gate 200 illustrated and described with respect to FIG. 2, is a conductance-based logic gate adapted to perform the $F_4$ function, a linearly separable function, which may be represented as follows:

$$F_4 = sgn(2 \cdot g_i + 1 \cdot p_i + 1 \cdot g_{i-1} - 2)$$

where "+" represents addition and "−" represents multiplication. Of course, the logic gate 500 may be designed to perform other functions and still remain within the broad scope of the present invention.

In the illustrated embodiment, the logic gate 500 includes a logic circuit 515 that dissipates DC power during an operation thereof. The logic gate 500 therefore advantageously includes a circuit (power reduction circuit 540) for decreasing the DC power dissipated in the logic circuit 515.

The logic circuit 515 includes a summer 520 having first, second and third binary inputs adapted to receive corresponding first, second and third input binary digits $g_{i-1}$, $g_i$, $p_i$, with corresponding first, second and third conductances representing first, second and third discrete weights. The summer 520 is adapted to generate a weighted sum of the first, second and third input binary digits $g_{i-1}$, $g_i$, $p_i$ at a summing junction 525. Since the logic gate is adapted to perform the $F_4$ function, the logical function performed by the summer 520 may be represented as follows:

$$F_4' = g_i \vee (p_i \wedge g_{i-1})$$

where "$\vee$" represents a logical OR function and a "$\wedge$" represents a logical AND function.

The logic circuit 515 further includes a quantizer 530, coupled to the summer 520. In the illustrated embodiment, the quantizer 530 is an inverter that generates an output binary digit $F_4$ at a binary output 535 thereof that is a function of the weighted sum. The summer 520 and the quantizer 530 are described in detail in the '947 and '811 applications.

The logic circuit 515 further includes an optional noise-suppression logic circuit 522, coupled to the summer 520, that increases a noise tolerance of the logic gate 500. In the illustrated embodiment, the function performed by the noise-suppression logic circuit 522 may be represented as follows:

$$NSL = p_i \wedge g_{i-1}$$

where "$\wedge$" represents a logical AND function.

The logic circuit 515 still further includes an optional anti-floating logic circuit 524, coupled to the summer 520, that prevents the weighted sum from being in an indefinite state. In the illustrated embodiment, the function performed by the anti-floating logic circuit 524 may be represented as follows:

$$AFL = g_i' \wedge p_i \wedge g_{i-1}$$

where "$\wedge$" represents a logical AND function. See the '367 application for more information on noise tolerant conductance-based logic gates employing noise suppression and anti-floating logic circuits.

The power reduction circuit 540 includes first and second combinatorial logic power down circuits 550, 555 that respectively develop first and second power down signals PD1, PD2 as a function of an input-data signal IDS and the output binary digit $F_4$ at the binary output 535 of the logic gate 500. While the illustrated embodiment of the power reduction circuit 540 receives the output binary digit $F_4$ from the binary output 535 of the logic gate 500, the function $F_4$ may be available at other points within the logic gate 500 as well.

The first power down circuit 550 develops the first power down signal PD1 as a function of an input-data signal IDS and the output binary digit $F_4$. The first power down circuit 550 performs a first power down function to develop the first power down signal PD1, which may be represented (by equation 1) as follows:

$$PD1 = IDS \vee (IDS^\tau \wedge F_4) \qquad (1)$$

where "$\vee$" represents a logical OR function, a "$\wedge$" represents a logical AND function, "'" represents negation and "$\tau$" represents a small delay.

The second power down circuit 555 develops the second power down signal PD2 as a function of the input-data signal IDS and the output binary digit $F_4$. The second power down circuit 555 performs a second power down function to develop the second power down signal PD2, which may be represented (by equation 2) as follows:

$$PD2 = (IDS \land IDS^\tau) \lor (IDS \land F_4) \quad (2)$$

where "∨" represents a logical OR function, a "∧" represents a logical AND function, "‾" represents negation and "τ" represents a small delay.

The power reduction circuit 540 further includes first and second switches 560, 565 coupled to the first and second power down circuits 550, 555, respectively. In the illustrated embodiment, the first switch 560 is coupled between a positive reference voltage $V^+$ (e.g., VDD) and the summer 520. The second switch 565 is coupled between the summer 520 and a negative reference voltage $V^-$ (e.g., GND). The first and second switches 560, 565 are adapted to receive the first and second power down signals PD1, PD2, respectively and interrupt the DC current to the summer 520 as a function thereof. The power reduction circuit 540 may thus reduce the DC power dissipated in the logic circuit 515 and, therefore, the logic gate 500.

The logic gate 500 operates as follows. Initially, the input-data signal IDS is low (i.e., 0). The first power down signal PD1 is high (see equation 1) and the second power down signal PD2 is low (see equation 2). Both the first and second switches are therefore OFF, isolating the summer 520 from both the positive and negative reference voltages $V^+$, $V^-$.

Then, at a time prior to the arrival of the first, second and third input binary digits $g_{i-1}$, $g_i$, $p_i$ at the inputs of the summer 520, the input-data signal IDS will go high. The time-delayed input-data signal $IDS^\tau$ is still low, but will go high after a time delay of τ. During this time period, the first power down signal PD1 becomes low (see equation 1), activating the first switch 560. The second power down signal PD2 becomes high (see equation 2), activating the second switch 565. The summer 520 is now coupled to both the positive and negative reference voltages $V^+$, $V^-$ to receive DC current therefrom and is thus capable of computing the function $F_4$.

In the illustrated embodiment, the time delay τ is preferably sufficient to allow for (1) the computation of the first and second power down signals PD1, PD2 by the first and second power down circuits 550, 555; (2) the switching of the first and second switches 560, 565; and (3) the computation of the function $F_4$ by the summer 520 and the quantizer 530.

After the time delay τ, the time-delayed input-data signal $IDS^\tau$ will go high. The input-data signal IDS is already high. The quantizer 530 has computed the function $F_4$ and the binary output 535 of the logic gate 500 is now stable. If the binary output $F_4$ (or another version of the function $F_4$, not necessarily at the binary output 535) is high, both the first and second power down signals PD1, PD2 developed by the first and second power down circuits 550, 555, respectively, will be high (see equations 1 and 2). The first switch 560 will thus be turned OFF while the second switch 565 will remain ON to couple to the summer 520 to the negative reference voltage $V^-$. With the summing junction 525 coupled only to the negative reference voltage $V^-$, the summing junction 525, which was already at a low level (since the output $F_4$ of the quantizer 530 was high), will move towards the negative reference voltage $V^-$. Since the quantizer 530 is, in the illustrated embodiment, an inverter, the quantizer 530 will invert the low at the summing junction 525 and keep the high value already computed at the binary output $F_4$.

Alternatively, if the binary output $F_4$ is low, both the first and second power down signals PD1, PD2 developed by the first and second power down circuits 550, 555, respectively, will become low (see equations 1 and 2). The second switch 565 will thus be turned OFF while the first switch 560 will remain ON to couple to the summer 520 to the positive reference voltage $V^+$. With the summing junction 525 coupled only to the positive reference voltage $V^+$, the summing junction 525, which was already at a high level (since the output $F_4$ of the quantizer 530 was low), will move towards the positive reference voltage $V^+$. Since the quantizer 530 is an inverter, the quantizer 530 will now invert the high at the summing junction 525 and keep the low value already computed at the binary output $F_4$.

In either case, the binary output $F_4$ may remain stable, even after one of the first or second switches 560, 565 has disconnected the summer 520 from either the positive or the negative reference voltages $V^+$, $V^-$.

While the illustrated embodiment includes the noise suppression logic circuit 522, the noise suppression logic circuit 522 is not required to practice the present invention.

Figure 6:
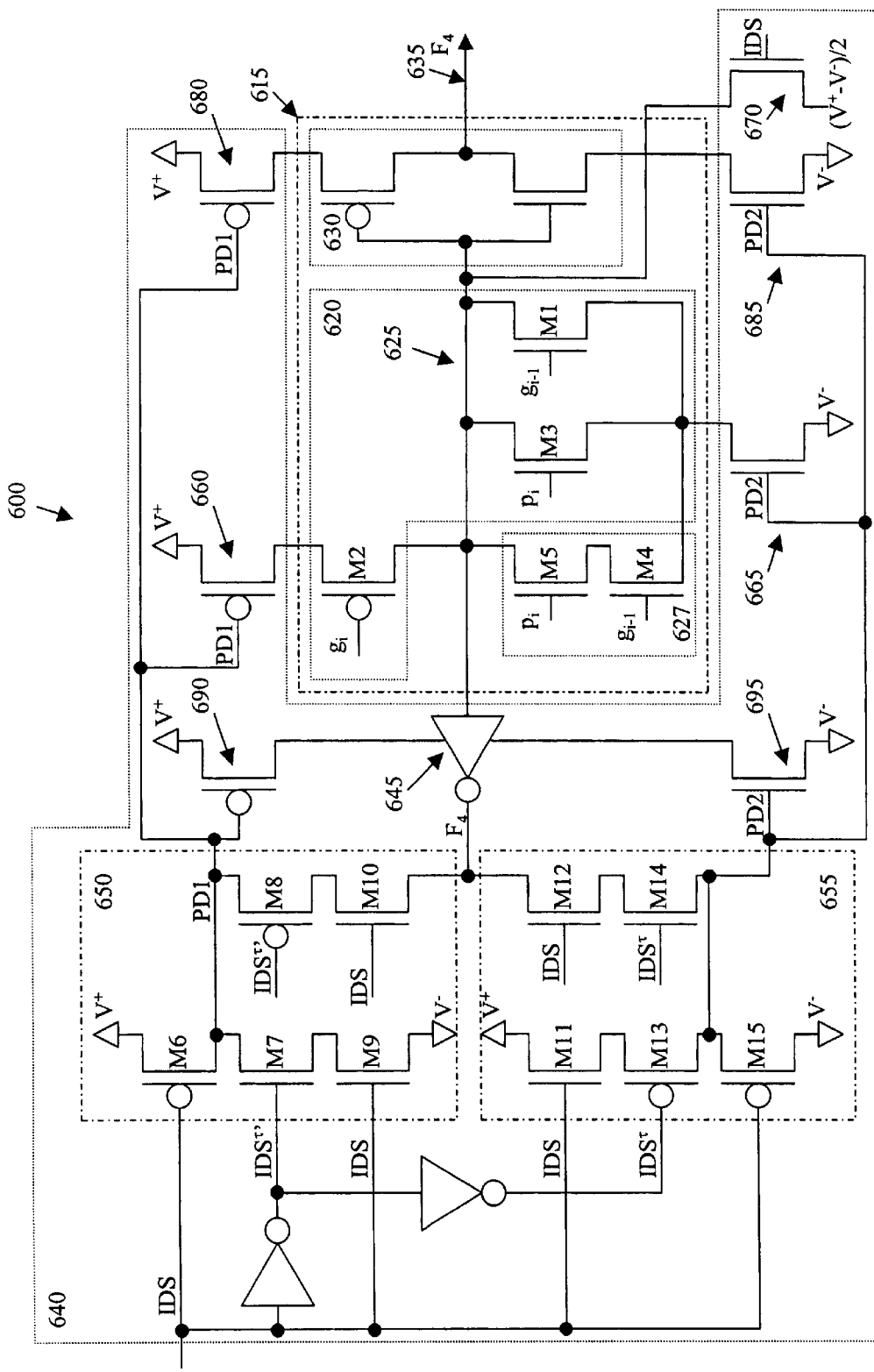
FIG. 6 illustrates a more detailed schematic diagram of an embodiment of a logic gate constructed in accordance with the principles of the present invention.

Turning now to FIG. 6, illustrated is a more detailed schematic diagram of an embodiment of a logic gate 600 constructed in accordance with the principles of the present invention. The logic gate 600 is similar to the logic gate 500 illustrated and described with respect to FIG. 5 and is adapted to perform the $F_4$ function described above with respect to FIG. 5.

The logic gate 600 includes a logic circuit 615 that dissipates DC power during an operation thereof. The logic gate 600 therefore advantageously includes a circuit (power reduction circuit 640) for decreasing the DC power dissipated in the logic circuit 615.

The logic circuit 615 includes a summer 620 having first, second and third binary inputs adapted to receive corresponding first, second and third input binary digits $g_{i-1}$, $g_i$, $p_i$. The first, second and third input binary digits $g_{i-1}$, $g_i$, $p_i$ are applied to the gates of first, second and third MOS transistors M1, M2, M3, respectively. The first and third MOS transistors M1, M3 are n-channel MOS transistors coupled between a summing junction 625 of the summer 620 and a negative reference voltage $V^-$ (e.g., GND). The second MOS transistor M2 is a p-channel coupled between the summing junction 625 and a positive reference voltage $V^+$ (e.g., VDD). The first, second and third input binary digits $g_{i-1}$, $g_i$, $p_i$ may thus activate the respective MOS transistors to couple the respective reference voltages to the summing junction 625 as a function of the corresponding particular input binary digit. The summer 620 then generates a weighted sum of the first, second and third input binary digits $g_{i-1}$, $g_i$, $p_i$.

The logic circuit 615 further includes a quantizer 630, coupled to the summer 620. The quantizer 630 generates an output binary digit $F_4$ at a binary output 635 thereof that is a function of the weighted sum. In the illustrated embodiment, the quantizer 630 is a CMOS inverter that is capable of providing fast quantization of the weighted sum. Of course, other types of quantizers are well within the broad scope of the present invention. The summer 620 and the quantizer 630 are described in detail in the '947 and '811 applications.

The logic circuit 615 further includes an optional noise-suppression logic circuit 627, coupled to the summer 620, that increases a noise tolerance of the logic gate 600. In the illustrated embodiment, the noise-suppression logic circuit 627 includes fourth and fifth MOS transistors M4, M5. The first and third input binary digits $g_{i-1}$ and $p_i$ are applied to the gates of the fourth and fifth MOS transistors M4, M5, respectively. See the '367 application for more information on noise tolerant conductance-based logic gates employing the noise-suppression logic circuit 627. While the illustrated embodiment does not require an anti-floating logic circuit, those skilled in the art will realize that the anti-floating logic circuit described in the '367 application may be employed as required by the logic gate.

The power reduction circuit 640 includes first and second combinatorial logic power down circuits 650, 655 that respectively develop first and second power down signals PD1, PD2 as a function of an input-data signal IDS and the output binary digit $F_4$ at the binary output 635 of the logic gate 600.

In the illustrated embodiment, the output binary digit $F_4$ is replicated at the input to the first and second power down circuits 650, 655 by a second inverter 645. The second inverter 645 advantageously inverts the signal at the summing junction 625 to provide a representation of the output binary digit $F_4$ to the first and second power down circuits 650, 655. Since the output binary digit $F_4$ developed by the second inverter 645 need only drive the first and second power down circuits 650, 655, the second inverter 645 may be made much smaller than the inverter of the quantizer 630, which should generally be of sufficient size to drive a number of other logic gates, including those not situated in the immediate vicinity of the logic gate 600. Further, the smaller size of the second inverter 645 advantageously decreases an intrinsic capacitance of the second inverter 645, thereby allowing the second inverter 645 to provide a faster computation of the output binary digit $F_4$ at the output thereof. Of course, the size of the second inverter 645 may be varied as necessary to adjust a propagation delay therethrough.

The first power down circuit 650 develops the first power down signal PD1 as a function of an input-data signal IDS and the output binary digit $F_4$. The first power down circuit 650 performs a first power down function to develop the first power down signal PD1:

$$PD1 = IDS' \vee (IDS^\tau \wedge F_4)$$

wherein IDS' is an inverted input-data signal and $IDS^\tau$ is a time-delayed input-data signal.

In the illustrated embodiment, the first power down circuit 650 includes sixth, seventh, eighth, ninth and tenth MOS transistors M6, M7, M8, M9, M10 arranged in a pass transistor implementation of the first power down function. The sixth MOS transistor M6 (a p-channel MOS transistor) is coupled to a positive reference voltage $V^+$ and is adapted to receive the input-data signal IDS. The seventh and eighth transistors M7, M8 (n-channel and p-channel MOS transistors, respectively) are coupled to the sixth MOS transistor M6 and are adapted to receive an inverted time-delayed input-data signal $IDS^{\tau'}$. The ninth and tenth MOS transistors M9, M10 (n-channel transistors) are coupled to the seventh and eighth MOS transistors M7, M8, respectively, and are both adapted to receive the input-data signal IDS. The ninth MOS transistor M9 is further coupled to a negative reference voltage $V^-$. The tenth MOS transistor M10 is coupled to the output binary digit $F_4$. While the first power down circuit 650 is a particular pass transistor implementation of the first power down function, those skilled in the pertinent art realize that other implementations of the first power down function are possible and are well within the broad scope of the present invention.

The second power down circuit 655 develops the second power down signal PD2 as a function of the input-data signal IDS and the output binary digit $F_4$. The second power down circuit 655 performs a second power down function to develop the second power down signal PD2:

$$PD2 = (IDS \wedge IDS^{\tau'}) \vee (IDS \wedge F_4)$$

In the illustrated embodiment, the second power down circuit 655 includes eleventh, twelfth, thirteenth, fourteenth, and fifteenth MOS transistors M11, M12, M13, M14, M15 arranged in a pass transistor implementation of the second power down function. The eleventh MOS transistor M11 (an n-channel MOS transistor) is coupled to a positive reference voltage $V^+$ and is adapted to receive the input-data signal IDS. The twelfth MOS transistor M12 (an n-channel MOS transistor) is coupled to the output binary digit $F_4$ and receives the input-data signal IDS. The thirteenth and fourteenth MOS transistors M13, M14 (p-channel and n-channel MOS transistors, respectively) are coupled to the eleventh and twelfth MOS transistors M11, M12, respectively and are adapted to receive the time-delayed input-data signal $IDS^\tau$. The fifteenth MOS transistor M15 (a p-channel transistor) is coupled between the thirteenth and fourteenth MOS transistors M13, M14 and a negative reference voltage $V^-$, and is adapted to receive the input-data signal IDS. While the second power down circuit 655 is a particular pass transistor implementation of the second power down function, those skilled in the pertinent art realize that other implementations of the second power down function are possible and are well within the broad scope of the present invention.

The power reduction circuit 640 further includes first and second switches 660, 665 coupled to the first and second power down circuits 650, 655, respectively. In the illustrated embodiment, the first switch 660 is coupled between a positive reference voltage $V^+$ (e.g., VDD) and the summer 620. The second switch 665 is coupled between the summer 620 and a negative reference voltage $V^-$ (e.g., GND). The first and second switches 660, 665 are adapted to receive the first and second power down signals PD1, PD2, respectively and interrupt the DC current to the summer 620 as a function thereof. The power reduction circuit 640 may thus reduce the DC power dissipated in the logic circuit 615 and, therefore, the logic gate 600.

The power reduction circuit 640 still further includes a pre-charge circuit 670 that pre-charges the summing junction 625 to a predetermined level. In the illustrated embodiment, the pre-charge circuit 670 is a switch that couples the summing junction 625 to a voltage level $(V^+ - V^-)/2$ (a midpoint between the positive reference voltage $V^+$ and the negative reference voltage $V^-$). By pre-charging the summing junction 625 to about a midpoint between the possible output levels, the pre-charge circuit 670 may allow the output 635 of the logic gate 600 to more quickly assume a desired level upon input of the input binary digits at the inputs of the logic gate 600.

The power reduction circuit 640 further includes third and fourth switches 680, 685 coupled to the first and second power down circuits 650, 655, respectively. In the illustrated embodiment, the third switch 680 is coupled between a positive reference voltage $V^+$ (e.g., VDD) and the quantizer 630. The fourth switch 685 is coupled between the quantizer 630 and a negative reference voltage $V^-$ (e.g., GND). The third and fourth switches 680, 685 are adapted to receive the first and second power down signals PD1, PD2, respectively and interrupt current to the quantizer 630 as a function thereof. The power reduction circuit 640 may thus reduce the power dissipated in the quantizer 630 and, therefore, the logic gate 600.

In the illustrated embodiment, the logic gate 600 includes the second inverter 645. The power reduction circuit 640, therefore, further includes a fifth switch 690 coupled between a positive reference voltage V⁺ (e.g., VDD) and the second inverter 645. The power reduction circuit 640 still further includes a sixth switch 695 coupled between the second inverter 645 and a negative reference voltage V⁻ (e.g., GND). The fifth and sixth switches 690, 695 are adapted to receive the first and second power down signals PD1, PD2, respectively (from the first and second power down circuits 650, 655) and interrupt current to the second inverter 645 as a function thereof. The power reduction circuit 640 may thus reduce the power dissipated in the second inverter 645 and, therefore, the logic gate 600.

Although the present invention has been described in detail, those skilled in the art should understand that they can make various changes, substitutions and alterations herein without departing from the spirit and scope of the invention in its broadest form.

What is claimed is:

1. For use with a logic gate having at least two binary inputs adapted to receive corresponding input binary digits, said logic gate having a logic circuit that dissipates DC power during an operation thereof, a circuit for decreasing said DC power dissipated in said logic circuit, comprising:
   a combinatorial logic power down circuit that develops a power down signal as a function of an input-data signal and at least one of said input binary digits; and
   a switch, coupled to said power down circuit, that interrupts DC current to at least a portion of said logic circuit as a function of said power down signal.

2. The circuit as recited in claim 1 wherein said logic gate is a conductance-based logic gate.

3. The circuit as recited in claim 1 wherein said power down circuit comprises at least one pass transistor.

4. The circuit as recited in claim 1 wherein said power down circuit develops said power down signal as a function of said input-data signal and all of said input binary digits.

5. The circuit as recited in claim 1 wherein said input-data signal precedes said input binary digits.

6. The circuit as recited in claim 2 wherein said logic circuit includes a summer, said switch interrupting said DC current to said summer.

7. The circuit as recited in claim 2 wherein said logic circuit includes a summer coupled between a positive reference voltage and a negative reference voltage, said switch interrupting said DC current by decoupling said summer from said positive reference voltage.

8. The circuit as recited in claim 7 further comprising a second switch that interrupts said DC current by decoupling said summer from said negative reference voltage.

9. The circuit as recited in claim 2 wherein said logic circuit includes a summer coupled between a positive reference voltage and a negative reference voltage, said switch interrupting said DC current by decoupling said summer from said negative reference voltage.

10. The circuit as recited in claim 2 wherein said logic circuit includes a quantizer, said circuit further comprising a second switch that interrupts current to said quantizer.

11. The circuit as recited in claim 2 wherein said logic circuit includes a summer, said circuit further comprising a pre-charge circuit that pre-charges said summer to a predetermined voltage level.

12. The circuit as recited in claim 11 wherein said predetermined voltage level is about a midpoint between a positive reference voltage and a negative reference voltage.

13. For use with a logic gate having at least two binary inputs adapted to receive corresponding input binary digits, said logic gate having a logic circuit that dissipates DC power during an operation thereof, a method of decreasing said DC power dissipated in said logic circuit, comprising:
   developing a power down signal as a function of an input-data signal and at least one of said input binary digits; and
   interrupting DC current to at least a portion of said logic circuit as a function of said power down signal.

14. The method as recited in claim 13 wherein said logic gate is a conductance-based logic gate.

15. The method as recited in claim 13 wherein said developing is performed by a combinatorial logic power down circuit comprising at least one pass transistor.

16. The method as recited in claim 13 wherein said developing comprises developing said power down signal as a function of said input-data signal and all of said input binary digits.

17. The method as recited in claim 13 wherein said input-data signal precedes said input binary digits.

18. The method as recited in claim 14 wherein said logic circuit includes a summer, said interrupting comprising interrupting said DC current to said summer.

19. The method as recited in claim 14 wherein said logic circuit includes a summer coupled between a positive reference voltage and a negative reference voltage, said interrupting comprising decoupling said summer from said positive reference voltage.

20. The method as recited in claim 13 wherein said interrupting is performed by a switch.

21. The method as recited in claim 14 wherein said logic circuit includes a summer coupled between a positive reference voltage and a negative reference voltage, said interrupting comprising decoupling said summer from said negative reference voltage.

22. The method as recited in claim 14 wherein said logic circuit includes a quantizer, said method further comprising interrupting current to said quantizer.

23. The method as recited in claim 14 wherein said logic circuit includes a summer, said method further comprising pre-charging said summer to a predetermined voltage level.

24. The method as recited in claim 23 wherein said predetermined voltage level is about a midpoint between a positive reference voltage and a negative reference voltage.

25. For use with a logic gate having a logic circuit that dissipates DC power during an operation thereof, a circuit for decreasing said DC power dissipated in said logic circuit, comprising:
   a combinatorial logic power down circuit that develops a power down signal as a function of an input-data signal and an output binary digit generated at an output of said logic gate; and
   a switch, coupled to said power down circuit, that interrupts DC current to at least a portion of said logic circuit as a function of said power down signal.

26. The circuit as recited in claim 25 wherein said logic gate is a conductance-based logic gate.

27. The circuit as recited in claim 25 wherein said power down circuit comprises at least one pass transistor.

28. The circuit as recited in claim 25 wherein said input-data signal precedes input binary digits presented at corresponding binary inputs of said logic gate.

29. The circuit as recited in claim 26 wherein said logic circuit includes a summer, said switch interrupting said DC current to said summer.

30. The circuit as recited in claim 26 wherein said logic circuit includes a summer coupled between a positive reference voltage and a negative reference voltage, said switch interrupting said DC current by decoupling said summer from said positive reference voltage.

31. The circuit as recited in claim 30 further comprising a second switch that interrupts said DC current by decoupling said summer from said negative reference voltage.

32. The circuit as recited in claim 31 wherein said switch and said second switch are operated alternatively.

33. The circuit as recited in claim 26 wherein said logic circuit includes a summer coupled between a positive reference voltage and a negative reference voltage, said switch interrupting said DC current by decoupling said summer from said negative reference voltage.

34. The circuit as recited in claim 26 wherein said logic circuit includes a quantizer, said circuit further comprising a second switch that interrupts current to said quantizer.

35. The circuit as recited in claim 26 wherein said logic circuit includes a summer, said circuit further comprising a pre-charge circuit that pre-charges said summer to a predetermined voltage level.

36. The circuit as recited in claim 35 wherein said predetermined voltage level is about a midpoint between a positive reference voltage and a negative reference voltage.

37. For use with a logic gate having a logic circuit that dissipates DC power during an operation thereof, a method of decreasing said DC power dissipated in said logic circuit, comprising:
  receiving an input data signal;
  developing a power down signal as a function of said input-data signal and an output binary digit generated at an output of said logic gate; and
  interrupting DC current to at least a portion of said logic circuit as a function of said power down signal.

38. The method as recited in claim 37 wherein said logic gate is a conductance-based logic gate.

39. The method as recited in claim 37 wherein said developing is performed by at least one pass transistor.

40. The method as recited in claim 37 further comprising receiving input binary digits at corresponding binary inputs of said logic gate after said receiving said input data signal.

41. The method as recited in claim 38 wherein said logic circuit includes a summer, said interrupting comprising interrupting said DC current to said summer.

42. The method as recited in claim 38 wherein said logic circuit includes a summer coupled between a positive reference voltage and a negative reference voltage, said interrupting comprising decoupling said summer from said positive reference voltage.

43. The method as recited in claim 37 wherein said interrupting is performed by a switch.

44. The method as recited in claim 38 wherein said logic circuit includes a summer coupled between a positive reference voltage and a negative reference voltage, said interrupting comprising decoupling said summer from said negative reference voltage.

45. The method as recited in claim 38 wherein said logic circuit includes a summer coupled between a positive reference voltage and a negative reference voltage, said interrupting comprising alternatively decoupling said summer from said positive reference voltage and said negative reference voltage.

46. The method as recited in claim 38 wherein said logic circuit includes a quantizer, said method further comprising interrupting current to said quantizer.

47. The method as recited in claim 38 wherein said logic circuit includes a summer, said method further comprising pre-charging said summer to a predetermined voltage level.

48. The method as recited in claim 47 wherein said 2 predetermined voltage level is about a midpoint between a positive reference voltage and a negative reference voltage.

49. A logic gate, comprising:
  at least two binary inputs adapted to receive corresponding input binary digits;
  a logic circuit that dissipates DC power during an operation thereof; and
  a circuit for decreasing said DC power dissipated in said logic circuit, including:
    a combinatorial logic power down circuit that develops a power down signal as a function of an input-data signal and at least one of said input binary digits, and
    a switch, coupled to said power down circuit, that interrupts DC current to at least a portion of said logic circuit as a function of said power down signal.

50. The logic gate as recited in claim 49 wherein said power down circuit develops said power down signal as a function of said input-data signal and all of said input binary digits.

51. The logic gate as recited in claim 49 wherein said logic circuit includes a summer, said switch interrupting said DC current to said summer.

52. The logic gate as recited in claim 49 wherein said logic circuit includes a quantizer, said circuit further comprising a second switch that interrupts current to said quantizer.

53. The logic gate as recited in claim 49 wherein said logic circuit includes a summer, said circuit further comprising a pre-charge circuit that pre-charges said summer to a predetermined voltage level.

54. A logic gate, comprising:
  a logic circuit that dissipates DC power during an operation thereof; and
  a circuit for decreasing said DC power dissipated in said logic circuit, including:
    a combinatorial logic power down circuit that develops a power down signal as a function of an input-data signal and an output binary digit generated at an output of said logic gate, and
    a switch, coupled to said power down circuit, that interrupts DC current to at least a portion of said logic circuit as a function of said power down signal.

55. The logic gate as recited in claim 54 wherein said logic circuit includes a summer, said switch interrupting said DC current to said summer.

56. The logic gate as recited in claim 54 wherein said logic circuit includes a quantizer, said circuit further comprising a second switch that interrupts current to said quantizer.

57. The logic gate as recited in claim 54 wherein said logic circuit includes a summer, said circuit further comprising a pre-charge circuit that pre-charges said summer to a predetermined voltage level.

58. The logic gate as recited in claim 54 further comprising a latching circuit employable to latch said output binary digit.

59. A processor, comprising:
  memory;
  a control unit coupled to said memory; and
  an execution unit coupled to said memory to communicate data therewith, coupled to said control unit to receive direction therefrom and having a conductance-based logic gate, including:
    a logic circuit, having:
      a summer that generates a weighted sum of input binary digits presented at binary inputs thereof, said summer dissipating DC power during an operation thereof, and a quantizer, coupled to an output of said summer, that generates an output binary digit at a binary output thereof that is a function of said weighted sum; and a circuit for decreasing said DC power dissipated in said logic circuit, having:
   a combinatorial logic power down circuit that develops a power down signal as a function of an input-data signal and said output binary digit, and
   a switch, coupled to said power down circuit, that interrupts DC current to said summer as a function of said power down signal.

60. The processor as recited in claim 59 wherein said power down circuit comprises at least one pass transistor.

61. The processor as recited in claim 59 wherein said input-data signal precedes said input binary digits.

62. The processor as recited in claim 59 wherein said summer is coupled between a positive reference voltage and a negative reference voltage, said switch interrupting said DC current by decoupling said summer from said positive reference voltage.

63. The processor as recited in claim 62 wherein said logic gate further comprising a second switch that interrupts said DC current by decoupling said summer from said negative reference voltage.

64. The processor as recited in claim 63 wherein said switch and said second switch are operated alternatively.

65. The processor as recited in claim 63 wherein said switch and said second switch are operable to increase a noise margin of said logic gate.

66. The processor as recited in claim 59 wherein said summer is coupled between a positive reference voltage and a negative reference voltage, said switch interrupting said DC current by decoupling said summer from said negative reference voltage.

67. The processor as recited in claim 59 wherein said quantizer is subject to dissipating power, said circuit further comprising a second switch that interrupts current to said quantizer.

68. The processor as recited in claim 59 wherein said logic gate further comprises a pre-charge circuit that pre-charges said summer to a predetermined voltage level.

69. The processor as recited in claim 68 wherein said predetermined voltage level is about a midpoint between a positive reference voltage and a negative reference voltage.

70. The processor as recited in claim 59 wherein said logic gate further comprises a latching circuit employable to latch said output binary digit.

* * * * *

UNITED STATES PATENT AND TRADEMARK OFFICE
CERTIFICATE OF CORRECTION

PATENT NO. : 6,259,275 B1
DATED : July 10, 2001
INVENTOR(S) : Valeriu Beiu

It is certified that error appears in the above-identified patent and that said Letters Patent is hereby corrected as shown below:

Column 3,
Line 11, delete "20"

Column 6,
Line 30, "_" should be -- . --

Signed and Sealed this

Twenty-ninth Day of January, 2002

Attest:

JAMES E. ROGAN
*Attesting Officer*   *Director of the United States Patent and Trademark Office*